United States Patent
Göötz et al.

(10) Patent No.: US 10,236,426 B2
(45) Date of Patent: *Mar. 19, 2019

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventors: Britta Göötz, Regensburg (DE); Wolfgang Mönch, Pentling (DE); Norwin von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/473,918

(22) Filed: Mar. 30, 2017

(65) Prior Publication Data

US 2017/0207373 A1    Jul. 20, 2017

Related U.S. Application Data

(63) Continuation of application No. 14/650,545, filed as application No. PCT/EP2013/076265 on Dec. 11, 2013, now Pat. No. 9,614,131.

(30) Foreign Application Priority Data

Dec. 12, 2012 (DE) .......................... 10 2012 112 149

(51) Int. Cl.
*H01L 33/50* (2010.01)
*H01L 33/58* (2010.01)
*H01L 27/15* (2006.01)

(52) U.S. Cl.
CPC ............ *H01L 33/507* (2013.01); *H01L 27/15* (2013.01); *H01L 27/153* (2013.01);
(Continued)

(58) Field of Classification Search
None
See application file for complete search history.

(56) References Cited

U.S. PATENT DOCUMENTS 9,012,926 B2    4/2015    von Malm et al.
9,614,131 B2 *  4/2017    Gootz ................... H01L 33/505
(Continued)

FOREIGN PATENT DOCUMENTS

DE    102009037186 A1    2/2011
EP       2296179 A2       3/2011
(Continued)

OTHER PUBLICATIONS

Belton, C.R., et al., "New light from hybrid inorganic-organic emitters," Journal of Physics D: Applied Physics, vol. 11, Apr. 4, 2008, 12 pages.

(Continued)

*Primary Examiner* — Charles D Garber
*Assistant Examiner* — Xiaoming Liu
(74) *Attorney, Agent, or Firm* — Slater Matsil, LLP

(57) ABSTRACT

An optoelectronic semiconductor component and a method for producing an optoelectronic semiconductor component are disclosed. In an embodiment, the component includes a carrier, a multi-pixel semiconductor chip that emits electromagnetic radiation during operation, wherein the semiconductor chip is arranged on the carrier, and wherein the semiconductor chip has a plurality of individually activatable pixels capable of generating primary radiation and a wavelength conversion element for at least partially converting the primary radiation emitted from the semiconductor chip into electromagnetic secondary radiation, wherein an active zone of the multi-pixel semiconductor chip extends (Continued)

continuously over the plurality of pixels, and wherein the wavelength conversion element is implemented in one piece.

13 Claims, 2 Drawing Sheets

(52) U.S. Cl.
CPC .......... *H01L 27/156* (2013.01); *H01L 33/502* (2013.01); *H01L 33/505* (2013.01); *H01L 33/58* (2013.01); *H01L 2933/0041* (2013.01); *H01L 2933/0058* (2013.01)

(56) References Cited

U.S. PATENT DOCUMENTS

| | | | |
|---|---|---|---|
| 2004/0145308 A1 | 7/2004 | Rossner et al. | |
| 2009/0085471 A1 | 4/2009 | Tsujimura | |
| 2009/0294780 A1 | 12/2009 | Chou et al. | |
| 2010/0090229 A1 | 4/2010 | Harada | |
| 2011/0121732 A1* | 5/2011 | Tsutsumi | F21S 48/1159 315/77 |
| 2011/0260193 A1 | 10/2011 | Kraeuter | |
| 2012/0119237 A1* | 5/2012 | Leatherdale | H01L 27/156 257/88 |
| 2012/0193660 A1* | 8/2012 | Donofrio | H01L 33/505 257/98 |
| 2012/0250303 A1* | 10/2012 | Asaki | H01L 27/322 362/231 |
| 2014/0077235 A1* | 3/2014 | Kwon | H01L 33/486 257/88 |

FOREIGN PATENT DOCUMENTS

| | | |
|---|---|---|
| EP | 2460191 A2 | 6/2012 |
| WO | 2006097876 A1 | 9/2006 |
| WO | 2009143802 A1 | 12/2009 |
| WO | 2011014490 A2 | 2/2011 |

OTHER PUBLICATIONS

Daly, D., "The Method of Manufacturing Microlenses by Melting Photoresist," Microlens Array, Chapter 3, Mar. 26, 2003, pp. 40-77.

Sinzinger, S., et al., "Lithographic fabrication technology in Microoptics," 2nd edition, Mar. 26, 2003, pp. 33-76.

* cited by examiner

OPTOELECTRONIC SEMICONDUCTOR COMPONENT AND METHOD FOR PRODUCING AN OPTOELECTRONIC SEMICONDUCTOR COMPONENT

CROSS-REFERENCE TO RELATED APPLICATIONS

This patent application is a continuation of U.S. application Ser. No. 14/650,545, filed on Jun. 8, 2015 which is a national phase filing under section 371 of PCT/EP2013/076265, filed Dec. 11, 2013, which claims the priority of German patent application 10 2012 112 149.4, filed Dec. 12, 2012, each of which is incorporated herein by reference in its entirety.

TECHNICAL FIELD

An optoelectronic semiconductor component is specified. In addition, a method for producing an optoelectronic semiconductor component is specified.

BACKGROUND

PCT Publication No. WO2006/097876 and U.S. Patent Application Publication No. 2004/0145308 describe optoelectronic semiconductor components.

SUMMARY

Embodiments of the present application specify an optoelectronic semiconductor component, component in short, which is particularly efficient. Further embodiments of the present application specify a method for producing a particularly efficient optoelectronic semiconductor component.

According to one aspect, the semiconductor component is preferably implemented for use in projection and/or headlight applications. For example, the component can be used as a light source or part of a light source in an automobile headlight or an optical projection device.

The component has a carrier. The component furthermore has a semiconductor chip. The semiconductor chip is arranged on the carrier. The semiconductor chip is fastened on the carrier. The fastening of the semiconductor chip can be performed, for example, by gluing, soldering, silver sintering, in a direct bonding method, or by means of contacting by way of contact protrusions (bumps).

The carrier is used for the mechanical stabilization of the semiconductor chip. A growth substrate for the preferably epitactic deposition of a semiconductor layer sequence of the semiconductor chip is accordingly not necessary for stabilization and can therefore be removed during the production of the components.

The semiconductor chip is preferably a semiconductor chip based on a III-V semiconductor material. The semiconductor chip is preferably a light-emitting diode (LED) chip. The semiconductor chip is capable of emitting electromagnetic radiation. The semiconductor chip preferably emits colored light. However, the semiconductor chip can also emit ultraviolet (UV) radiation.

The semiconductor chip has an active zone. The active zone is implemented to emit the electromagnetic radiation. The semiconductor chip preferably has two or more elements or pixels or image points, respectively. The semiconductor chip is preferably a multi-pixel semiconductor chip. The active zone of the semiconductor chip preferably extends continuously over a plurality of the elements, in particular over all elements. The elements are preferably identical with respect to the material composition and the layer thicknesses thereof, neglecting production-related variations, which can occur in a lateral direction over the component.

The elements are capable of generating electromagnetic radiation, in particular electromagnetic primary radiation. The elements are individually activatable. The carrier preferably has two or more switches, which are each provided for controlling at least one element. The switches are implemented, for example, as individual transistors or as a circuit having multiple transistors and capacitors. The switches are provided for electrical connection to the individually activatable elements. In operation of the component, each element is activatable by means of the associated switch. In operation, therefore a plurality of elements can be activated simultaneously, in particular all elements can be activated simultaneously. Furthermore, it is possible to operate different elements independently of one another at different times.

A surface of the semiconductor chip or the elements which faces away from the carrier is preferably free of electrical contact points such as bond pads. The risk of shading and/or absorption of a part of the electromagnetic radiation emitted by the elements in operation due to the electrical contact points is reduced in this manner. Complex method steps in conjunction with the production of such a contact point, such as the polishing of the surface of the semiconductor chip facing away from the carrier and in particular the surface of the elements, and/or the productions of metal webs for current spreading, which have a large thickness but small lateral extension, and/or measures which restrict or prevent the current injection into regions of the semiconductor chip below the electrical contact point, such as the implementation of an electrically insulating layer, a Schottky barrier, and/or an ion-implanted region below the contact point, can advantageously be omitted, for example. This can preferably be achieved in that both types of charge carrier are supplied to the semiconductor chips or the elements from the side facing toward the carrier.

The component furthermore has a wavelength conversion element. The wavelength conversion element is arranged downstream from the semiconductor chip in the emission direction, in particular in the form of a wavelength conversion layer. The wavelength conversion element is arranged on the surface of the semiconductor chip facing away from the carrier. It can directly border the semiconductor chip or it is fastened by means of a connecting means on the semiconductor chip.

The wavelength conversion element is implemented for the at least partial conversion of the primary radiation, which is emitted from the semiconductor chip and in particular from the elements, into electromagnetic secondary radiation. In other words, the wavelength conversion element is implemented to convert the radiation, which is emitted from the semiconductor chip or from the elements, partially or completely into further radiation having a wavelength which differs from the emitted radiation, in particular is greater.

The wavelength conversion element has structuring. The structuring of the wavelength conversion element is preferably implemented and arranged such that crosstalk of the radiation emitted from the various individually activatable elements of the semiconductor chip is prevented.

The wavelength conversion element in particular has structuring into partial regions. In other words, the wavelength conversion element is implemented so that it is divided into partial regions. The division into partial regions represents a lateral division or a division in the lateral direction of the wavelength conversion element in this case. "Lateral direction" means a direction parallel to the main extension direction of the component in this context. "Vertical direction" is a direction perpendicular to the main extension direction of the component, i.e., it refers, for example, to the direction along which the thickness of the component is defined.

At least one individually activatable element of the semiconductor chip is associated with each partial region of the wavelength conversion element. A number of partial regions preferably corresponds to a number of individually activatable elements of the semiconductor chip. The association of the partial regions with the elements is one-to-one in particular. In other words, in the case of a one-to-one association, each partial region is associated with precisely one individually activatable element and/or vice versa.

The risk of optical crosstalk between adjacent elements in operation of the component can be reduced by the structuring of the wavelength conversion element. That is to say, each element only excites the generation of secondary radiation in the associated partial region of the wavelength conversion element in the scope of the production tolerance. Adjacent partial regions of the wavelength conversion element are pumped hardly or not at all by primary radiation of the element which is not directly associated. A required contrast ratio and a sharp optical separation between the individual elements is therefore ensured. Due to the clear separation between the individual elements, various projected illumination patterns on the evaluation plane (for example, on a road) are shown with better contour and differentiability.

In addition, an improved color-angle characteristic of the component can be ensured by the structuring. Due to the improved color-angle characteristic, no or at least significantly reduced color deviation effects occur in the event of a switchover between various projected illumination patterns.

According to at least one embodiment of the component, the wavelength conversion element is implemented in one piece. In other words, the structured wavelength conversion element has coherent partial regions. A separation of the wavelength conversion element into individual, noncoherent partial regions or even the provision of multiple wavelength conversion elements is not necessary. The component is thus constructed particularly simply.

According to at least one embodiment of the component, the wavelength conversion element consists of a ceramic. For example, the wavelength conversion element can have or consist of an yttrium-aluminum garnet doped with cerium, YAG in short, and/or a lutetium-aluminum garnet, LuAG in short, and/or a lutetium-yttrium-aluminum garnet, LuYAG in short. The wavelength conversion element can also have a doped silicon nitride or silicon oxynitride or silicate or aluminate. For example, the wavelength conversion element contains an alkaline earth silicon nitride doped with $Eu^{2+}$ and/or an alkaline earth aluminum silicon nitride, wherein the alkaline earth metal is barium or calcium or strontium, for example. These materials are distinguished above all by their high stability. Furthermore, a ceramic is distinguished by its high thermal conductivity. This has a particularly advantageous effect on the thermal management of the semiconductor chip. Furthermore, the wavelength conversion element can also have a correspondingly doped semiconductor material, for example, a II-VI compound semiconductor material such as ZnSe or a III-V compound semiconductor material such as AlInGaN.

Alternatively thereto, the wavelength conversion element can also have a phosphor in a matrix material. The matrix material can be, for example, a plastic, a glass, or a ceramic. The phosphor can be provided, for example, in the form of particles in the matrix material. The phosphor can in turn be a ceramic phosphor and/or an organic phosphor.

According to at least one embodiment of the component, the wavelength conversion element has one or more trenches, for example, three or four trenches. The respective trench is preferably implemented on a surface of the wavelength conversion element facing away from the semiconductor chip. Alternatively thereto, however, the respective trench can also be implemented on a surface of the wavelength conversion element facing toward the semiconductor chip. The respective trench preferably represents an indentation or opening on the surface of the wavelength conversion element. The trench preferably extends in this case from the opening on the surface of the wavelength conversion element into the wavelength conversion element.

However, the respective trench does not completely penetrate the wavelength conversion element. The wavelength conversion element preferably has a height or vertical extension of greater than or equal to 1 μm, for example, 10 μm, and less than or equal to 300 μm, for example, 100 μm. The respective trench has a depth or vertical extension such that it penetrates the wavelength conversion element by 80% or less, for example, 70% or 60%. Vertical extension is to be understood in this case, for example, as an extension perpendicular to a main extension plane of the wavelength conversion element. In particular, a "vertical" direction can be a direction toward or away from the carrier.

The respective trench furthermore has a depth such that it penetrates the wavelength conversion element by at least 20%, for example, 25% or 30%. In other words, the trench preferably has a depth or vertical extension between at least 0.2 μm and at most 240 μm, for example, 80 μm, depending on the vertical extension of the wavelength conversion element.

The wavelength conversion element has a width or lateral or horizontal extension of greater than or equal to 100 μm and less than or equal to 10 cm. The partial regions of the wavelength conversion element each have a width of greater than or equal to 2 μm, for example, 10 μm, and less than or equal to 500 μm, for example, 100 μm.

The respective trench has a width or lateral extension of less than or equal to 20 μm, for example, 10 μm or 1 μm. In other words, the lateral extension of the respective trench is small in consideration of the lateral extension of the wavelength conversion element. The width of the respective trench is defined in this case, for example, at the widest point of the trench.

The trenches are implemented to at least partially separate the partial regions of the wavelength conversion element from one another. The trenches are preferably arranged equidistantly to one another. Therefore, the individual partial regions, which are partially separated from one another by the trenches, preferably have an equal size or spatial extension.

The trenches can have different profiles. For example, the trenches can be implemented as V-shaped. However, a rectangular or round shape of the trenches is also conceivable. In particular, any trench shape is conceivable which is capable of causing structuring of the wavelength conversion element into partial regions.

With the aid of the trenches in the wavelength conversion element, the crosstalk of the radiation emitted from the various elements of the semiconductor chip is prevented.

Therefore, a particularly efficient component is provided, which ensures a sharp optical separation between the individual elements.

According to at least one embodiment of the component, the respective trench has two flanks arranged opposite to one another. The flanks form the inner surface of the respective trench and extend transversely to the main extension plane of the wavelength conversion element, for example. The flanks are coated with a nontransparent material. The flanks are preferably coated using a mirror material, for example, using silver (Ag), aluminum (Al), a dielectric layer, or a layer sequence made of a dielectric material and a reflective metal. The nontransparent material can also have a diffuse scatterer or a diffuse scattering material in a transparent matrix material. Alternatively thereto, the nontransparent material can also have an index of refraction such that radiation incident on the nontransparent material is totally reflected by the nontransparent material. In other words, the nontransparent material can be implemented as totally reflective.

The nontransparent material advantageously contributes to preventing crosstalk of the radiation emitted from two adjacent elements of the semiconductor chip. This can be performed, for example, by the reflection of primary radiation and/or secondary radiation by the nontransparent material.

According to at least one embodiment of the component, the respective trench is filled. The respective trench is preferably completely filled. In particular, the trench is filled such that a surface of the trench facing away from the semiconductor chip terminates flush with the surface of the wavelength conversion element facing away from the semiconductor chip and/or a surface of the trench facing toward the semiconductor chip terminates flush with the surface of the wavelength conversion element facing toward the semiconductor chip.

The trench is filled with a filling material. The trench can be filled, for example, by the above-described nontransparent material. In this case, the nontransparent material forms the filling material. However, any other material which is capable of filling the trenches can be used as the filling material. The filling material preferably has a coefficient of thermal expansion which is adapted to the coefficient of thermal expansion of the wavelength conversion element.

The filling material can be applied to the above-described layer made of nontransparent material. In this case, the nontransparent material directly adjoins the filling material. Alternatively thereto, however, the trench can also be filled with the filling material, without nontransparent material having been applied to the flanks. In this case, the material of the wavelength conversion element directly adjoins the filling material.

The surface of the trench facing away from the semiconductor chip terminates flush with the surface of the wavelength conversion element facing away from the semiconductor chip due to the filling. In other words, the surface of the wavelength conversion element facing away from the semiconductor chip is flat or level. This makes a further system construction easier, or the connection of the component to microoptic elements, for example, a lens for shaping the spatial light distribution.

For example, the trench can be filled with a glass. The thermal conductivity of the wavelength conversion element can be increased in the lateral direction in particular by the filling of the trenches, which has an advantageous effect on the thermal management of the semiconductor chip.

According to at least one embodiment of the component, the wavelength conversion element is structured into a plurality of microlenses, for example, two, three, or four microlenses. The respective microlens is implemented as convex. The individual microlenses are preferably at least partially separated from one another by the above-described trenches. Each of the microlenses is advantageously associated with a single activatable element of the semiconductor chip.

By way of this special shaping of the partial regions of the wavelength conversion element, an improved color-over-angle characteristic of the emitted radiation can be brought about.

According to a further aspect, an optoelectronic semiconductor component is specified. The component is implemented for use in projection and/or headlight applications, for example, in an adaptive automobile headlight. However, the component can also be used for flash functions, solid-state lighting (SSL), or for high-power LEDs. A high-power LED is understood in this context to mean that the semiconductor chip can have a power consumption of at least 0.5 W, in particular at least 3 W.

The component has a carrier. All features which were described in conjunction with the carrier of the above-described component also apply for the carrier described here.

The component furthermore has a semiconductor chip. The semiconductor chip is arranged on the carrier. The semiconductor chip is preferably a semiconductor chip based on a III-V semiconductor material, preferably an LED chip. The semiconductor chip is used to emit electromagnetic radiation, preferably light. The semiconductor chip preferably emits colored light. Alternatively, however, the semiconductor chip can also emit UV radiation, for example.

The semiconductor chip has at least one individually activatable element. The individually activatable element is capable of generating primary radiation. All features which were described in conjunction with an individually activatable element of the above-described component also apply to the individually activatable element described here. The component can also have a plurality of individually activatable elements, for example, two, three, four, or more individually activatable elements. The semiconductor chip can be a multi-pixel semiconductor chip.

The component has a wavelength conversion element. The wavelength conversion element is arranged downstream from the semiconductor chip in the emission direction. The wavelength conversion element is implemented and arranged to at least partially convert the primary radiation, which is emitted by the semiconductor chip or the individually activatable element, into electromagnetic secondary radiation. The wavelength conversion element is implemented in one piece.

The wavelength conversion element can consist of a ceramic. Alternatively, the wavelength conversion element can have a phosphor in a matrix material, for example, glass, plastic, or ceramic.

According to a further aspect, a method is described for producing an optoelectronic semiconductor component, preferably an optoelectronic semiconductor component as described here. In particular, the semiconductor component produced in this case preferably corresponds to the semiconductor component described under the first aspect. Accordingly, all features disclosed for this semiconductor component are also disclosed for the method and vice versa. The method has the following steps:

In a first step, the above-described carrier is provided. The carrier is used for the mechanical stabilization of the semiconductor chip. The carrier can have a plurality of switches. The number of the switches preferably corresponds to the number of the individually activatable elements of the semiconductor chip.

In a further step, the above-described semiconductor chip is provided. The semiconductor chip has two or more individually activatable elements. The semiconductor chip is preferably a multi-pixel semiconductor chip. The semiconductor chip is arranged on the carrier. Furthermore, the semiconductor chip is electrically connected to the switches arranged in the carrier.

In a further step, a plate made of converter material is provided. The plate is implemented in one piece. In particular, the plate does not consist of multiple parts. The plate is level. The plate is unstructured. In particular, the plate does not yet have structuring into partial regions at this point in time. The plate preferably consists of a ceramic, for example, LuAG or YAG. However, the plate can also consist of a plastic, for example, silicone, PC, or acrylic, which has phosphor particles.

In a further step, the plate is structured to implement the above-described wavelength conversion element. After this step the wavelength conversion element has structuring into partial regions. The number of the partial regions of the wavelength conversion element preferably corresponds to the number of the individually activatable elements. The wavelength conversion element obtained by the structuring is in one piece. In other words, cutting through of the plate is not performed by the structuring into the partial regions.

In a further step, the wavelength conversion element is arranged on the semiconductor chip or fastened thereon. The arrangement is performed in this case such that an individually activatable element of the semiconductor chip is associated with each partial region of the wavelength conversion element. In particular, a partial region is preferably arranged vertically above an individually activatable element in each case. Alternatively thereto, however, the wavelength conversion element can also first be fastened on the semiconductor chip and then structured as described above.

The risk of optical crosstalk between adjacent elements of the semiconductor chip is reduced by the structuring of the wavelength conversion element. Therefore, an optimum contrast ratio and sharp optical separation between the individual elements can be ensured. In addition, an improved color-angle characteristic of the component is achieved by the structuring.

According to at least one embodiment, the plate has a ceramic. The plate is preferably structured in a green body state, i.e., before firing of the plate. The structuring of the plate is preferably performed by an implementation of one or more trenches in the plate.

If the implementation of the green body is performed, for example, by tape casting, the desired trench form is achieved by embossing or hot embossing in the green tape.

Alternatively thereto, injection molding of the slurry can be performed and the desired trench form can be achieved at the same time (simple molding, compression molding). In this case, the liquid converter mass is introduced into a corresponding casting mold (slurry casting). The cast body thus resulting corresponds to the green body identified above.

In a further step, the plate is fired for the final production of the wavelength conversion element.

According to at least one embodiment, the plate has a ceramic. The plate is preferably structured in a green body state. The structuring is performed by molding of the slurry in a microlens mold. A plate having a plurality of microlenses is preferably created by the molding process. In a further step, the plate is fired for the final production of the wavelength conversion element.

According to at least one embodiment, the plate has a ceramic. The structuring of the plate is performed in the following steps:

Firstly, a fired ceramic plate is provided. In this embodiment, the structuring is therefore not performed in a green state of the plate.

In a further step, cylindrical photoresist islands (photoresist posts) are defined on the plate. This is preferably performed by means of photolithography.

The plate having the photoresist islands is introduced into a furnace. This is followed by heating of the plate to create microlenses from the photoresist islands. This represents a common process for the production of microlenses. The technology is described, for example, in the books "Dan Daly: Microlens Arrays, ISBN-10 0748408932" and "Sinzinger/Jahns: Microoptics, ISBN-10 3527403558", the content of the disclosure of which is hereby incorporated by reference.

In a further step, the photoresist microlenses are transferred into the plate. This is preferably performed by means of reactive ion etching.

Alternatively thereto, the microlens structuring of the ceramic plate can also be performed in a green body state of the plate by a molding process, however, as was already described.

BRIEF DESCRIPTION OF THE DRAWINGS

The optoelectronic component and the method will be explained in greater detail hereafter on the basis of exemplary embodiments and the associated figures.

Identical, similar, or identically acting elements are provided with the same reference signs in the figures. The figures and the size relationships of the elements illustrated in the figures to one another are not to scale. Rather, individual elements can be shown exaggeratedly large for better illustration ability and/or for better comprehensibility.

DETAILED DESCRIPTION OF ILLUSTRATIVE EMBODIMENTS

Figure 1:
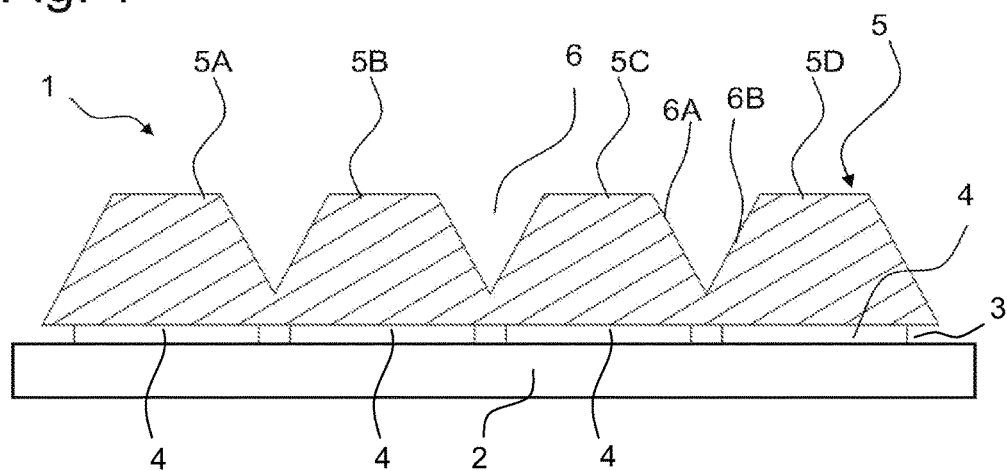
FIG. 1 shows a cross section of an optoelectronic semiconductor component.

FIG. 1 shows an optoelectronic semiconductor component 1, which has a semiconductor chip 3. The semiconductor chip 3 emits visible radiation or light. The semiconductor chip 3 is preferably an LED chip. In an alternative exemplary embodiment, the semiconductor chip 3 can also emit nonvisible radiation, for example, UV radiation.

The semiconductor chip 3 has individually activatable elements 4 or pixels or image points. The elements 4 emit electromagnetic radiation, preferably light.

The device 1 furthermore has a carrier 2. The semiconductor chip 3 is arranged on the carrier 2 and fastened thereon. The fastening of the semiconductor chip 3 can be performed, for example, by soldering, silver sintering, in a direct bonding method, or by means of contacting by contact protrusions (bumps).

A plurality of switches for the electrical activation of the elements 4 is preferably also implemented in the carrier 2 (not explicitly shown). The switches are implemented, for example, as individual transistor or as a circuit having a plurality of transistors and capacitors. The switches are provided for the electrical connection to the individually activatable elements 4. The carrier 2 can be implemented, for example, as a silicon carrier, in which the switches can be embodied in CMOS (complementary metal oxide semiconductor) technology.

In addition to the electrical activation of the elements 4 of the semiconductor chip 3, the carrier 2 is used for the mechanical stabilization of the semiconductor chip 3. A growth substrate for the preferably epitactic deposition of a semiconductor layer sequence of the semiconductor chip 3 is accordingly not required for stabilization and can therefore be removed during the production of the components 1.

The component 1 has a wavelength conversion element 5. The wavelength conversion element 5 is implemented in one piece. In other words, the wavelength conversion element 5 is not assembled from multiple individual parts, but rather is implemented, for example, from a plate made of converter material.

The wavelength conversion element 5 contains, for example, particles of a phosphor (for example, phosphorus) in a matrix made of a plastic, for example, PC, acrylic, epoxy resin, or silicone material, or made of glass or another ceramic. Alternatively thereto, the wavelength conversion element 5 can also consist of a ceramic (for example, YAG or LuAG). The wavelength conversion element 5 has a height or vertical extension of greater than or equal to 1 µm and less than or equal to 300 µm, for example, 50 µm. The wavelength conversion element 5 is arranged downstream from the semiconductor chip 3 in the emission direction. The wavelength conversion element 5 at least partially converts the primary radiation emitted from the semiconductor chip 3 or from the elements 4 into electromagnetic secondary radiation.

The wavelength conversion element 5 is structured. In particular, the wavelength conversion element 5 has partial regions 5A to 5D. Each element 4 is associated in this case with one of the partial regions 5A to 5D. The number of the partial regions 5A to 5D corresponds in this exemplary embodiment to the number of the elements 4. In an alternative exemplary embodiment (not explicitly shown), the number of the partial regions 5A to 5D can also be different from the number of the elements 4. For example, the number of the partial regions 5A to 5D can be less than the number of the elements 4. The partial regions 5A to 5D have the same shape. The partial regions 5A to 5D in particular have the same horizontal and vertical extension. The partial regions (5A, 5B, 5C, 5D) have a width or horizontal or lateral extension of greater than or equal to 3 µm and less than or equal to 200 µm, for example, 100 µm.

The wavelength conversion element 5 has trenches 6, which are implemented on a surface of the wavelength conversion element 5 facing away from the semiconductor chip 3. The trenches 6 each have two flanks 6A, 6B arranged opposite to one another.

The trenches 6 represent indentations or hollowed areas of the wavelength conversion element 5. The surface of the wavelength conversion element 5, which faces away from the semiconductor chip 3, is therefore not level. Rather, this surface has valleys, i.e., the above-mentioned trenches 6. The partial regions 5A to 5D are each partially separated from one another by one of the trenches 6.

The trenches 6 are implemented as V-shaped in this exemplary embodiment. However, the trenches 6 can also have any other arbitrary shape. For example, the trenches 6 can be implemented as rectangular or rounded. The trenches 6 each have the same shape and the same spatial extension.

The trenches 6 do not completely penetrate the wavelength conversion element 5. For example, the trenches 6 penetrate the wavelength conversion element 5 by at most 80%, for example, 70% or 60%. The trenches 6 penetrate the wavelength conversion element 5 by at least 20%, for example, 30% or 40%. In particular, the trenches 6 do not cause cutting through of the wavelength conversion element 5 into individual parts, but rather only the structuring into the individual regions 5A to 5D.

The risk of optical crosstalk between radiation emitted from adjacent elements 4 in operation of the component 1 can be reduced by the structuring of the wavelength conversion element 5.

Figure 2A:
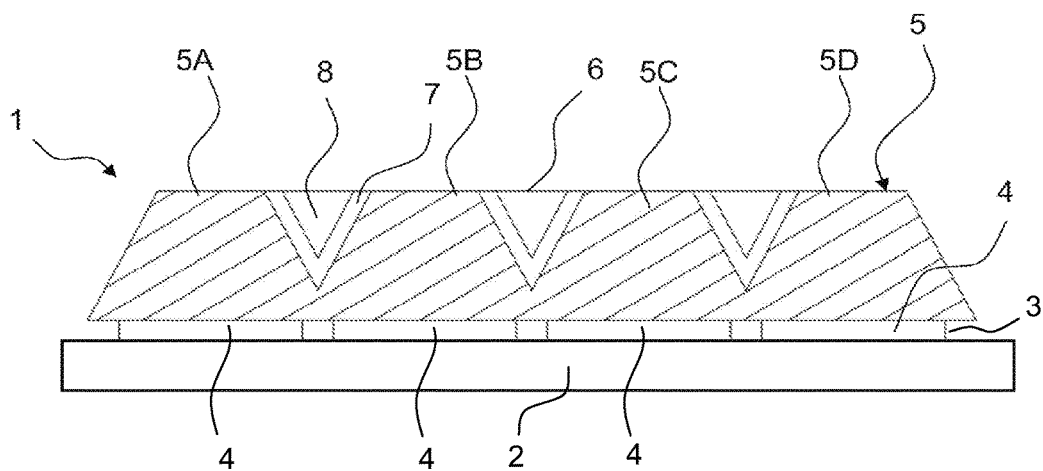
FIG. 2A shows a cross section of an optoelectronic semiconductor component according to a second exemplary embodiment.

FIG. 2A shows a cross section of a component 1 according to a second exemplary embodiment.

The component 1 shown here differs from the component 1 from FIG. 1 in that the flanks 6A, 6B of the trenches 6 are coated with a nontransparent material 7. The nontransparent material 7 is a mirror layer, for example.

Furthermore, the trenches 6 can be filled up completely in particular. The trenches 6 are filled with a filling material 8, for example, glass or a diffuse scattering material embedded in a transparent matrix material. If a diffuse scattering material embedded in a transparent matrix material is used, in particular the transparent material 7 can be omitted. Improved thermal conductivity of the wavelength conversion element 5 in the lateral direction is thus achieved, for example. The filling material 8 directly adjoins the nontransparent material 7.

Due to the filling of the trenches 6, the surface of the wavelength conversion element 5 which faces away from the semiconductor chip 3 is level. In particular, the surface no longer has indentations. This makes a further system construction or the bonding of the wavelength conversion element 5 to further elements, for example, a lens (not explicitly shown), easier.

Figure 2B:
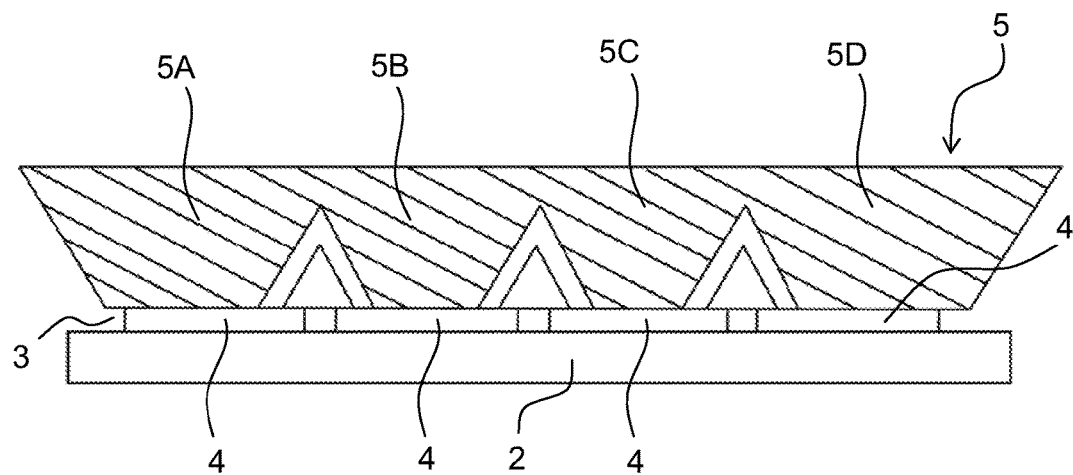
FIG. 2B shows a cross section of an optoelectronic semiconductor component according to a further exemplary embodiment.

FIG. 2B shows a cross section of a component 1 according to a further exemplary embodiment.

The component 1 shown here differs from the component 1 from FIG. 2A in that the trenches 6 are implemented on the surface of the wavelength conversion element 5 facing toward the semiconductor chip 3. In other words, the wavelength conversion element 5 is structured into the partial regions (5A, 5B, 5C, 5D) and is arranged such that the trenches 6 face toward the semiconductor chip 3. This can be achieved, for example, in that the wavelength conversion element 5 is firstly structured and is subsequently arranged on the semiconductor chip 3. It is possible in this case that the trenches 6 are completely filled. In particular, each trench 6 is filled such that a surface of the material in the trench facing toward the semiconductor chip terminates flush with the surface of the wavelength conversion element facing toward the semiconductor chip.

Figure 3:
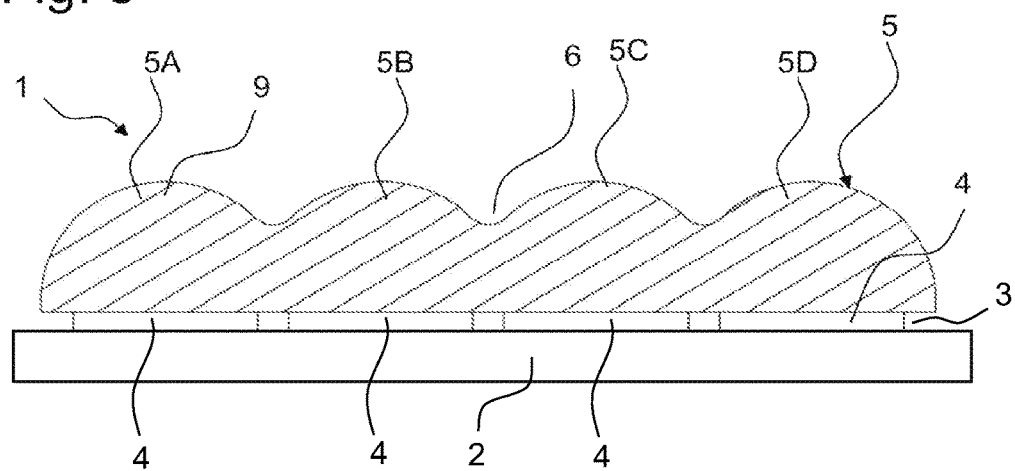
FIG. 3 shows a cross section of an optoelectronic semiconductor component according to a further exemplary embodiment.

FIG. 3 shows a cross section of a component 1 according to a further exemplary embodiment.

The component 1 shown here differs from the component 1 from FIG. 1 in that the partial regions 5A to 5D are implemented as convex. In particular, the partial regions 5A to 5D are implemented as convex microlenses 9.

The microlenses 9 are separated from one another by the trenches 6. The trenches 6 are implemented as rounded. Alternatively thereto (not explicitly shown), the trenches 6 implemented between the microlenses 9 can also be embodied as V-shaped or rectangular, however.

In this exemplary embodiment, the trenches 6 have a lesser depth than in the exemplary embodiment shown in FIG. 1. For example, the trenches 6 penetrate the wavelength conversion element 5 by 20% or 25% in this exemplary embodiment. In an alternative exemplary embodiment (not explicitly shown), the trenches 6 can also be implemented as deeper in this wavelength conversion element 5 and can penetrate the wavelength conversion element 5 by 70% or 80%, for example.

The components 1 described in FIGS. 1 to 3 are produced as follows:

In a first step, the above-described carrier 2 is provided. The semiconductor chip 3 is arranged on the carrier 2 and fastened thereon, for example, soldered.

In a next step, a plate made of converter material, for example, a ceramic, is provided. The plate is implemented in one piece.

In a further step, the plate is structured to implement the wavelength conversion element 5. Structuring in this context does not mean that cutting of the plate into individual parts is performed. Rather, the plate is divided into one or more partial regions 5A to 5D.

To obtain the wavelength conversion element 5 shown in FIGS. 1 to 3, the plate is structured such that the wavelength conversion element 5 thus obtained has structuring into the partial regions 5A to 5D, wherein an individually activatable element 4 of the semiconductor chip 3 is associated with each partial region 5A to 5B of the wavelength conversion element 5 in the further method.

To produce the wavelength conversion element 5 shown in FIGS. 1 and 2 (collectively, FIGS. 2A and 2B), the plate can be structured in this case in a green body state, for example, i.e., before the firing of the plate. The structuring of the plate is performed by the implementation of the trenches 6, which are shown in FIGS. 1 and 2, in the plate. If the green body is created by tape casting, the implementation of the trenches 6 can be performed, for example, by embossing in the green tape.

Alternatively thereto, injection molding of the slurry can also be performed, and the trenches 6 can be implemented at the same time. In this case, the liquid converter mass for the plate is introduced into a corresponding casting mold, whereby the trenches 6 are implemented in the desired shape and positional extension.

In a further step, the plate is then fired. Then, in an optional step, the flanks 6A and 6B can be coated with the nontransparent material 7 and the trenches 6 can be filled (see FIG. 2).

To produce the wavelength conversion element 5 shown in FIG. 3, the plate can be structured in a green body state. The structuring is performed by molding the slurry into the plurality of microlenses 9, which correspond to the regions 5A to 5D of the wavelength conversion element 5.

In a further step, the plate is then fired for the final production of the wavelength conversion element 5.

However, to produce the wavelength conversion element 5 shown in FIG. 3, the plate can also be structured in the fired state, i.e., not in the green body state. In this case, firstly cylindrical photoresist islands are defined on the plate, preferably by means of photolithography. The plate having the photoresist islands is then introduced into a furnace and heated to create the microlenses 9 from the photoresist islands. The photoresist microlenses are then transferred into the plate. This is preferably performed by means of reactive ion etching. After the structuring and therefore the production of a corresponding wavelength conversion element 5 (see FIGS. 1 to 3), it is arranged on the semiconductor chip 3. The arrangement is performed in this case such that preferably one partial region 5A to 5D is associated with each individually activatable element 4. Alternatively thereto, the structuring of the plate can also still be performed after the arrangement of the plate on the semiconductor chip 3.

In a last step, optical elements can be arranged downstream from the wavelength conversion element 5.

The invention is not restricted thereto by the description on the basis of the exemplary embodiments. Rather, the invention comprises every novel feature and every combination of features, which includes in particular every combination of features in the patent claims, even if this feature or this combination is not explicitly specified itself in the patent claims or exemplary embodiments.

What is claimed is:

1. An optoelectronic semiconductor component comprising:
    a carrier;
    a multi-pixel semiconductor chip configured to emit electromagnetic radiation during operation, wherein the multi-pixel semiconductor chip is arranged on the carrier, and wherein the multi-pixel semiconductor chip has a plurality of individually activatable pixels capable of generating primary radiation; and
    a wavelength conversion element for at least partially converting the primary radiation emitted from the multi-pixel semiconductor chip into electromagnetic secondary radiation having a different wavelength than the primary radiation,
    wherein an active zone of the multi-pixel semiconductor chip extends continuously over the plurality of pixels, the active zone emitting the primary radiation when in operation,
    wherein the wavelength conversion element is implemented in one piece,
    wherein the wavelength conversion element is arranged downstream from the multi-pixel semiconductor chip in a emission direction,
    wherein the wavelength conversion element is structured into partial regions, and
    wherein each individually activatable pixel of the multi-pixel semiconductor chip is associated one-to-one with a partial region of the wavelength conversion element.

2. The optoelectronic semiconductor component according to claim 1, wherein the wavelength conversion element has a trench, wherein the wavelength conversion element has a height of greater than or equal to 1 µm and less than or equal to 300 µm, and wherein the trench has a depth such that it penetrates the wavelength conversion element by at least 20% and at most 80%.

3. The optoelectronic semiconductor component according to claim 2, wherein the partial regions have a width of greater than or equal to 3 µm and less than or equal to 200 µm, and wherein the trench has a width of less than or equal to 20 µm.

4. The optoelectronic semiconductor component according to claim 2, wherein the trench has two flanks arranged opposite to one another, and wherein the flanks are coated with a nontransparent material.

5. The optoelectronic semiconductor component according to claim 2, further comprising a filling material filling the trench.

6. The optoelectronic semiconductor component according to claim 1, wherein a structuring of the wavelength conversion element is implemented and arranged such that crosstalk of radiation emitted from the individually activatable pixels of the multi-pixel semiconductor chip is prevented.

7. The optoelectronic semiconductor component according to claim 1, wherein the wavelength conversion element is structured into a plurality of microlenses, and wherein each respective microlens is a convex microlens.

8. The optoelectronic semiconductor component according to claim 1, wherein the wavelength conversion element comprises ceramic.

9. The optoelectronic semiconductor component according to claim 1, wherein the wavelength conversion element consists of ceramic.

10. The optoelectronic semiconductor component according to claim 1, wherein the wavelength conversion element includes a phosphor in a matrix material.

11. The optoelectronic semiconductor component according to claim 1, wherein both positive and negative charge carriers are supplied to the multi-pixel semiconductor chip from a side of the multi-pixel semiconductor chip facing toward the carrier.

12. The optoelectronic semiconductor component according to claim 1, wherein the carrier has a plurality of switches, and wherein each switch is configured to control at least one of the individually activatable pixels.

13. An optoelectronic semiconductor component comprising:

a carrier;

a multi-pixel semiconductor chip configured to emit electromagnetic radiation during operation, wherein the multi-pixel semiconductor chip is arranged on the carrier, and wherein the multi-pixel semiconductor chip has a plurality of individually activatable pixels capable of generating primary radiation; and a wavelength conversion element for at least partially converting the primary radiation emitted from the multi-pixel semiconductor chip into electromagnetic secondary radiation having a different wavelength than the primary radiation, wherein an active zone of the multi-pixel semiconductor chip extends continuously over the plurality of pixels, the active zone emitting the primary radiation when in operation, wherein the wavelength conversion element is implemented in one piece, wherein the wavelength conversion element is arranged downstream from the multi-pixel semiconductor chip in an emission direction, wherein the wavelength conversion element is structured into partial regions, wherein each individually activatable pixel of the multi-pixel semiconductor chip is associated one-to-one with a partial region of the wavelength conversion element, and wherein the wavelength conversion element has a trench, which is implemented on a surface of the wavelength conversion element facing toward the semiconductor chip.

* * * * *